(12) United States Patent
Nakamura et al.

(10) Patent No.: US 8,797,060 B2
(45) Date of Patent: Aug. 5, 2014

(54) SIGNAL PROCESSING DEVICE USING MAGNETIC FILM AND SIGNAL PROCESSING METHOD

(75) Inventors: Shiho Nakamura, Kanagawa-ken (JP); Hirofumi Morise, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1191 days.

(21) Appl. No.: 12/659,275

(22) Filed: Mar. 2, 2010

(65) Prior Publication Data
US 2010/0225312 A1 Sep. 9, 2010

(30) Foreign Application Priority Data
Mar. 4, 2009 (JP) ................ P2009-050543

(51) Int. Cl.
*H01L 43/02* (2006.01)
*H01L 41/12* (2006.01)
*H03K 3/45* (2006.01)

(52) U.S. Cl.
USPC .............................. 326/35; 326/101; 326/136

(58) Field of Classification Search
USPC ......................... 455/41.2; 326/35, 101, 136
See application file for complete search history.

(56) References Cited

U.S. PATENT DOCUMENTS

| 7,667,933 | B2 * | 2/2010 | Kudo et al. | 360/313 |
|---|---|---|---|---|
| 7,760,472 | B2 | 7/2010 | Sato et al. | |
| 8,164,148 | B2 | 4/2012 | Kim et al. | |
| 2007/0296516 | A1 | 12/2007 | Eshaghian-Wilner et al. | |
| 2010/0075599 | A1 * | 3/2010 | Xi et al. | 455/41.2 |

FOREIGN PATENT DOCUMENTS

| JP | 408102697 A | * 4/1996 | ........... H04B 1/707 |
|---|---|---|---|
| JP | 2008-084482 | 4/2008 | |
| JP | 2009-508353 | 2/2009 | |

OTHER PUBLICATIONS

Office Action dated Mar. 27, 2012 in Japanese Application No. 2009-050543 and partial English-language translation thereof.
M.P. Kostylev et al., "Spin-wave logical gates"; Applied Physics Letters 87, 153501 (2005), Oct. 2005.

* cited by examiner

*Primary Examiner* — Evan Pert
(74) *Attorney, Agent, or Firm* — Nixon & Vanderhye, P.C.

(57) ABSTRACT

A signal processing device includes a continuous film, a plurality of spin wave generators, and at least one signal detector. The continuous film includes at least one magnetic layer. The plurality of spin wave generators are provided on the continuous film in such a manner as to be in direct contact with the continuous film or be in contact with the continuous film while having an insulation layer interposed therebetween, and each has a contact surface with the continuous film in a dot shape and generates a spin wave in a region of the magnetic layer of the continuous film by receiving an input signal, the region being immediately under the contact surface. The signal detector is provided on the continuous film and detects, as an electrical signal, the spin waves generated by the spin wave generators and propagating through the continuous film.

15 Claims, 13 Drawing Sheets

| first spin wave generator / second spin wave generator | Input 0 | Input 1 |
|---|---|---|
| Input 0 | relative intensity 0 | relative intensity 1 |
| Input 1 | relative intensity 1 | relative intensity 2 |

FIG. 19A

| first spin wave generator / second spin wave generator | Input 0 | Input 1 |
|---|---|---|
| Input 0 | relative intensity 0 | relative intensity 1 |
| Input 1 | relative intensity 1 | relative intensity 2 |

FIG. 19B

SIGNAL PROCESSING DEVICE USING MAGNETIC FILM AND SIGNAL PROCESSING METHOD

CROSS REFERENCE TO RELATED APPLICATION

This application is based upon and claims the benefit of priority from the prior Japanese Patent Application No. 2009-050543, filed on Mar. 4, 2009, the entire contents of which are incorporated herein by reference.

FIELD OF THE INVENTION

The present invention relates to a signal processing device using a magnetic film and a signal processing method.

DESCRIPTION OF THE BACKGROUND

Miniaturization of CMOS devices has led to improved performance of a signal processing device. The device, as a logic processing unit, has contributed to higher functions and higher performances of products in various markets. It is expected, however, that the miniaturization, which has been promoted so far by solving a multitude of manufacturing problems, will eventually reach the physical limit. In addition, along with the miniaturization, power consumption of the devices has become a major problem. Dynamic power increasing with the miniaturization has been controlled, resulting in increased static power. This has led to skyrocketing power consumption along with the miniaturization.

Under these circumstances, various approaches are underway as a breakthrough towards further improvements of performances. One of the approaches is to construct a signal processing device which is based on non-Boolean algebra logic and specialized in particular processing. In particular, a processing technique called Morephic architecture encompasses neurocomputing, cellular nonlinear network, or the like, and excels at signal processing such as learning and pattern recognition, which CMOSs do not well. Such devices employ multi-input one-output signal processing as a basic unit of calculation, and the signal processing is based on multi-input addition. Accordingly, a structure of those signal processing devices is expected to widely differ from a conventional MOSFET structure having a signal ON/OFF function which is suited for sequential Boolean algebraic manipulation aimed at general logical manipulation.

Meanwhile, with respect to materials, information processing is being considered which uses light, spin or biotechnology or the like having degrees of freedom different from those of electric charge conventionally utilized. A spin MOSFET, a Datta-Das type spin transistor, a spin gain transistor and the like have been proposed as an information processing device using a spin. Many of these devices have an FET transistor structure and are suited for Boolean algebra operation. A transistor using a spin wave is also proposed (see, for example, USPA20070296516 or Appl. Phys. Lett. 87 (2005) 153501). Such a transistor is expected to be reduced in power consumption because it can be energized with small energy, in principle. However, since a spin wave is excited by a magnetic field generated from a transmission line structure in such devices, electricity needed for the excitation inevitably increases. In addition, the transmission line requires a large area, and thus does not have a structure suitable to be used as a multi-input electrode.

SUMMARY OF THE INVENTION

According to a first aspect of the invention, a signal processing device includes a continuous film, a plurality of spin wave generators, and at least one signal detector. The continuous film includes at least one magnetic layer. The plurality of spin wave generators are provided on the continuous film in such a manner as to be in direct contact with the continuous film or be in contact with the continuous film while having an insulation layer interposed therebetween, and each has a contact surface with the continuous film in a dot shape and generates a spin wave in a region of the magnetic layer of the continuous film by receiving an input signal, the region being immediately under the contact surface. The signal detector is provided on the continuous film and detects, as an electrical signal, the spin waves generated by the spin wave generators and propagating through the continuous film.

According to a second aspect of the invention, a signal processing method of the signal processing device according to the first aspect makes polarity of a current or a voltage correspond to any one of 0 and 1 of the input signal, and sets intensity of a detection signal detected by the signal detector to a signal output. The current or the voltage is inputted as an input signal to each of the spin wave generators. In the signal processing device, the signal detector is provided on a film surface of the continuous film, and a contact area of the signal detector with the continuous film is larger than a contact area of each of the spin wave generators with the continuous film.

According to a third aspect of the present invention, a signal processing method of the signal processing device according to the first aspect makes any one of presence and absence of a voltage correspond to any one of 0 and 1 of the input signal, and makes intensity of a detection signal detected by the signal detector a signal output. The voltage is inputted as an input signal to each of the spin wave generators. In the signal processing device, the signal detector is provided on a film surface of the continuous film, and a contact area of the signal detector with the continuous film is larger than a contact area of each of the spin wave generators with the continuous film.

BRIEF DESCRIPTION OF THE DRAWINGS

The accompanying drawings, which are incorporated in and constitute a part of this specification, illustrate embodiments of the invention and together with the description, serve to explain the principles of the invention.

FIGS. 19A and 19B are tables each showing effects of the signal processing device according to the fourth example.

DETAILED DESCRIPTION OF THE EMBODIMENTS

Figure 1:
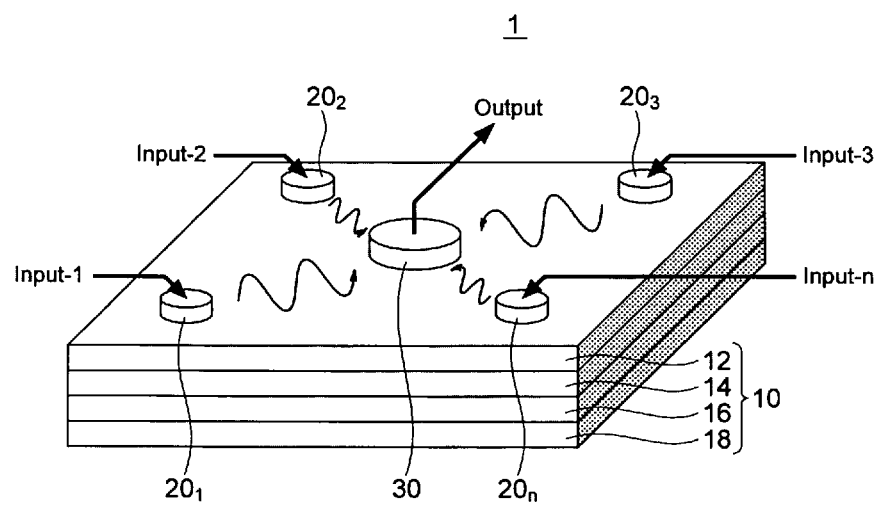
FIG. 1 is a schematic view showing a signal processing device according to a first embodiment.

Embodiments of the present invention will be described hereinafter with reference to accompanying drawings. In accompanying drawings, the same reference numerals denote the same or like portions, and a detailed description will be omitted wherever possible.

First Embodiment

FIG. 1 shows a basic structure of a signal processing device according to a first embodiment of the present invention. The signal processing device 1 includes a continuous film 10 which is provided on a substrate (not shown) and which contains at least one magnetic layer exhibiting ferromagnetism at room temperature, multiple spin wave generators $20_1$ to $20_n$ which are provided on the continuous film 10 via a contact surface, and at least one signal detection electrode (signal detector) 30. Alternatively, the drawing of FIG. 1 may be turned upside down. That is, the substrate may be disposed on the spin wave generators $20_1$ to $20_n$ and the at least one signal detection electrode (signal detector) 30, or under the continuous film 10.

Each spin wave generator $20_i$ (i=1 to n) is provided on the continuous film 10 via a dot-shaped contact surface, and capable of generating spin waves in a region of the magnetic layer constituting the continuous film 10, which is immediately under the contact surface, by applying a voltage or passing an electric current through the spin wave generator $20_i$ in a direction substantially perpendicular to the dot-shaped contact surface. The term "dot-shaped" means a circle, an oval, a quadrangle, a polygon or the like in the description. In addition, each spin wave generator $20_i$ (i=1 to n) is connected to an electrode and a signal source (not shown) from which an i-th input "Input-i" is supplied in the form of voltage or current.

The spin wave is generated in the magnetic layer of the continuous film 10 by spin torque or distortion introduced into magnetic anisotropy. The spin torque or the distortion is caused by voltage or current applied to each spin wave generator $20_i$ (i=1 to n). The spin wave generators $20_1$ to $20_n$ mean members for generating spin waves in the magnetic layer of the continuous layer 10 by either the spin torque or the distortion. However, if a maximum diameter of the dot shaped contact surface of each spin wave generator $20_i$ (i=1 to n) is larger than 500 nm, a magnetization structure of complex multi-domains is excited in the spin wave generator $20_i$. Thus, controlling spin waves becomes difficult, and such a structure is not desirable. Here, the "maximum diameter" means length of a long axis when the dot shape is oval, and means maximum length of a diagonal line when the dot shape is a quadrangle or polygon. Making the maximum diameter larger than 500 nm is also not desirable for providing two or more spin wave generators to give a multi-input performance to the signal processing device 1. Thus, it is desirable that each contact surface is a circle, an oval, or a polygon whose maximum diameter is 500 nm or smaller. When the maximum diameter is within that range, the spin wave generators are easy to handle, and have excellent controllability. It is also easy to provide portions for multi-input to the signal processing device 1.

The continuous film 10 will be explained hereinafter. There are two types of basic structures for the continuous film 10. One has a layered structure, including a magnetic layer 12/a spacer layer 14/a magnetic layer 16, as shown in FIG. 1. It should be noted that the layered structure in FIG. 1 has the magnetic layer 12/the spacer layer 14/the magnetic layer 16/an antiferromagnetic layer 18. The antiferromagnetic layer 18 functionally fixes a magnetization direction of the magnetic layer 16. In addition, the continuous film 10 is formed by laminating the antiferromagnetic layer 18, the magnetic layer 16, the spacer layer 14, and the magnetic layer 12 in this order. For the spacer layer 14, either one of a tunnel barrier material or a nonmagnetic metal material is used.

In general, a layered structure including a first magnetic layer, a spacer layer, and a second magnetic layer is known as a film structure for generating spin torque. However, such a film structure is intended for magnetization reversal or high-frequency oscillation. Thus, the structure is such that either a magnetization configuration of the first or the second magnetic layers is parallel or antiparallel, or that electrons having spin whose direction is perpendicular to in-plane magnetization are injected into a magnetic layer (at least one of the first and second magnetic layers) having in-plane magnetization. Here, the "in-plane magnetization" means magnetization substantially parallel to a film surface, and the "film surface" means an upper surface of each layer.

In contrast, in the embodiment, the magnetization directions of the two magnetic layers are arranged substantially perpendicular in order to achieve a structure for exciting spin waves with small energy, and to increase detection sensitivity as will be described later. This structure allows it to inject an electron having its spin directed to a certain in-plane direction into a spin wave propagation layer to propagate the spin. The spin wave propagation layer has magnetization directed to another in-plane direction to be substantially orthogonal to the direction of the electron spin. Alternatively, an electron having spin directed to a certain in-plane direction may be injected into a spin wave propagation layer which has magnetization directed perpendicular to a certain surface substantially orthogonal to the direction of the electron spin. Examples of the continuous film will be described with reference to FIG. 2A to FIG. 5B.

Figure 2A:
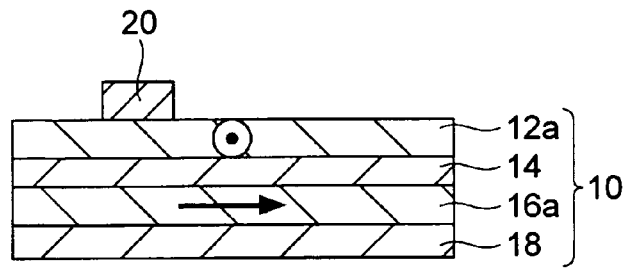
FIGS. 2A and 2B are cross sectional views each showing an example of a combination of a continuous film and a spin wave generator in a first embodiment.

FIG. 2A shows a first example of the continuous film 10 including two magnetic layers formed of in-plane magnetization films. The continuous film 10 of the first example has a layered structure of a magnetic layer 12a having magnetization substantially parallel to the film surface, a spacer layer 14, a magnetic layer 16a having magnetization to be substantially parallel to the film surface and substantially perpendicular to the magnetization of the magnetic layer 12a, and an antiferromagnetic layer 18. Also in the first example, a spin wave generator 20 is provided to contact the upper surface of the continuous film 10, that is, the upper surface of the magnetic layer 12a. Electrons having spin of a same direction as the magnetization of the magnetic layer 16a are injected into the magnetic layer 12a using the spin wave generator 20 to generate spin torque in the magnetic layer 12a, thereby exciting spin waves.

Figure 2B:
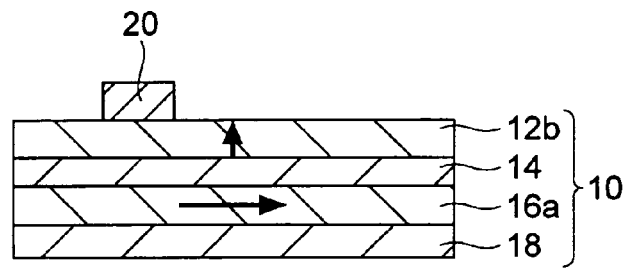

FIG. 2B shows a second example of the continuous film 10 where one magnetic layer mainly causing spin waves to be exited and propagate is a perpendicular magnetization layer and another magnetic layer is an in-plane magnetization layer. The continuous film 10 of the illustrative example has a layered structure of a magnetic layer 12b having magnetization substantially perpendicular to the film surface, a spacer layer 14, a magnetic layer 16a having magnetization substantially parallel to the film surface, and an antiferromagnetic layer 18. Also in the second example, a spin wave generator 20 is provided to contact the upper surface of continuous film 10, that is, the upper surface of the magnetic layer 12b. Electrons having spin of a same direction as the magnetization of the magnetic layer 16a are injected into the magnetic layer 12a using the spin wave generator 20 to generate spin torque in the magnetic layer 12a, thereby exciting spin waves. As in the example shown in FIG. 2B, it is desirable to make a spin wave propagation portion (magnetic layer 12b) of a perpendicular magnetization layer in order to prevent dependency of the spin wave property on a propagation direction of the spin wave. In any cases shown in FIGS. 2A and 2B, it is desirable to provide the antiferromagnetic layer 18 to the magnetic layer 16a as shown, in order to control magnetization of the magnetic layer 16a.

In these structures, the spin wave generator 20 includes a nonmagnetic conductive material. It is also desirable that a protection layer (not shown) is formed as an uppermost layer of the continuous film 10. To excite spin waves, it is desirable that the protection layer is conductive and has thickness of 100 nm or less. In addition, a tunnel barrier layer may be provided between the protection layer of the continuous film and the spin wave generator 20.

Figure 3A:
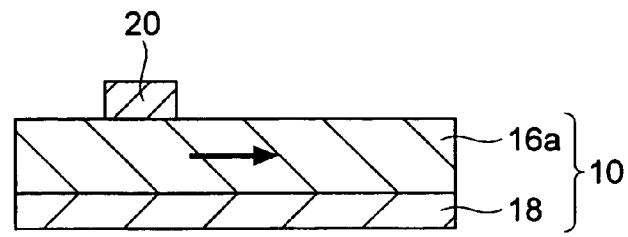
FIGS. 3A and 3B are cross sectional views each showing an example of a combination of a continuous film and a spin wave generator in the first embodiment.
Figure 3B:
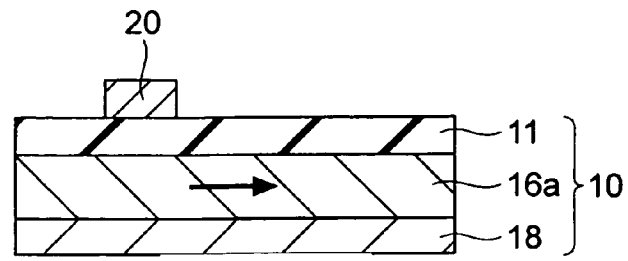

FIG. 3A shows a third example of the continuous film 10 in which a magnetic layer contained therein is a single layer. The continuous film 10 has a layered structure of the magnetic layer 16a having magnetization substantially parallel to a film surface, and the antiferromagnetic layer 18. Also in the third example, the spin wave generator 20 is provided to contact an upper surface of the continuous film 10, that is, an upper surface of the magnetic layer 16a. Also in this illustrative example, the spin wave generator 20 includes a nonmagnetic conducting material. Applying a voltage to the spin wave generator 20 changes magnetic anisotropy locally to excite spin waves. Also in this case, it is desirable to provide the antiferromagnetic layer 18 to the magnetic layer 16a on the side opposite to the surface on which the spin wave generator 20 is provided. Alternatively, the antiferromagnetic layer may not be provided. A conductive protection layer (not shown) may also be formed as a cap layer on the continuous film 10. Furthermore, an insulation layer 11 may be provided between the magnetic layer 16a and the spin wave generator 20, as in a fourth example shown in FIG. 3B.

Figure 4A:
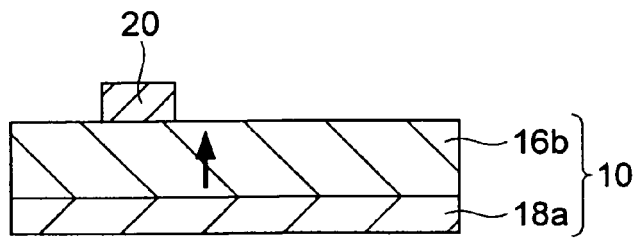
FIGS. 4A and 4B are cross sectional views each showing an example of a combination of a continuous film and a spin wave generator in the first embodiment.
Figure 4B:
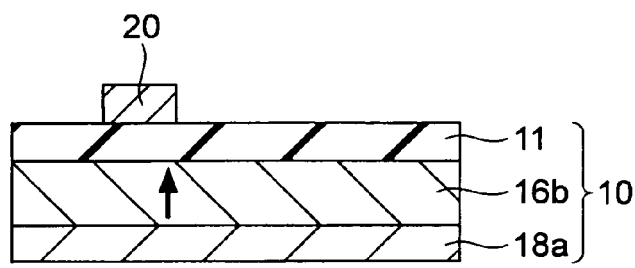

FIGS. 4A and 4B show fifth and sixth examples of the continuous film 10, respectively. The continuous film 10 in the fifth and sixth examples are different from the continuous film 10 of the third and fourth examples shown in FIGS. 3A and 3B, respectively, in that the magnetic layer 16a having the magnetization substantially parallel to the film surface is replaced by the magnetic layer 16b having magnetization substantially perpendicular to the film surface, and in that the antiferromagnetic layer 18 is replaced by the antiferromagnetic layer 18a. Since the magnetic layer 16b has the magnetization direction substantially perpendicular to the film surface, it can prevent the dependency of the spin wave property on the propagation direction of spin wave. On the one hand, when the magnetization direction is substantially parallel to the film surface, as in the continuous film 10 of the third and fourth examples, there is an advantage that the continuous film 10 is easy to manufacture. In addition, in the fifth and sixth examples, if a material of the magnetic layer 16b is selected appropriately (if a perpendicular magnetization material is used, for example), the antiferromagnetic layer 18a may not be provided.

Figure 5A:
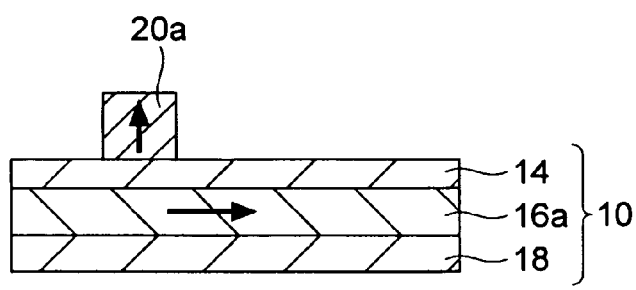
FIGS. 5A and 5B are cross sectional views each showing an example of a combination of a continuous film and a spin wave generator in the first embodiment.
Figure 5B:
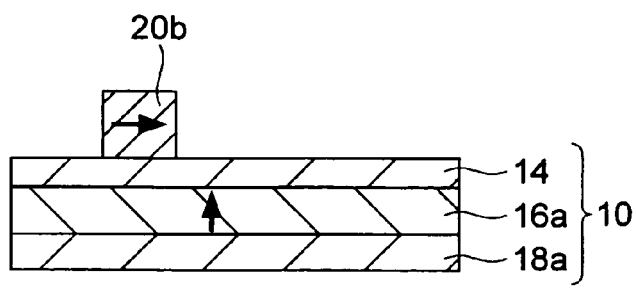
Figure 6A:
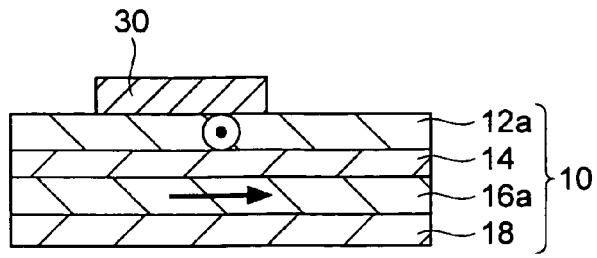
FIGS. 6A and 6B are cross sectional views each showing an example of a combination of a continuous film and a signal detection electrode in the first embodiment.
Figure 6B:
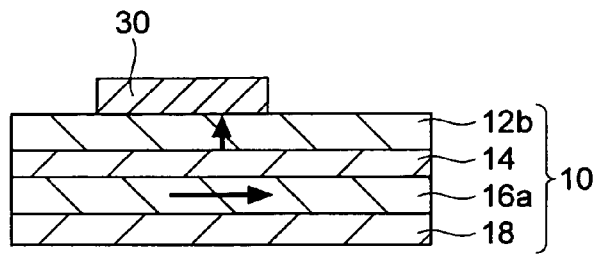
Figure 7A:
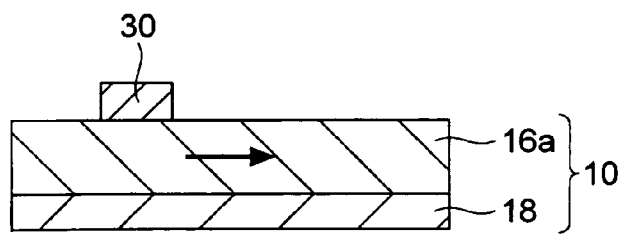
FIGS. 7A and 7B are cross sectional views each showing an example of a combination of a continuous film and a signal detection electrode in the first embodiment.
Figure 7B:
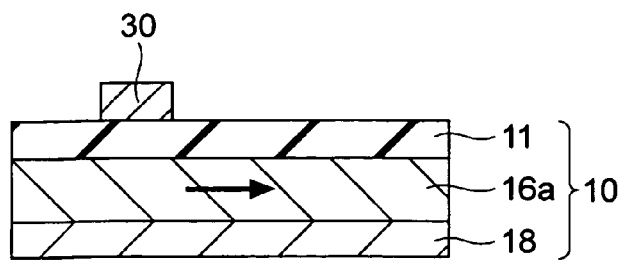
Figure 8A:
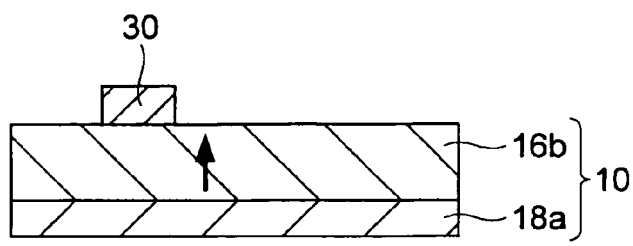
FIGS. 8A and 8B are cross sectional views each showing an example of a combination of a continuous film and a signal detection electrode in the first embodiment.
Figure 8B:
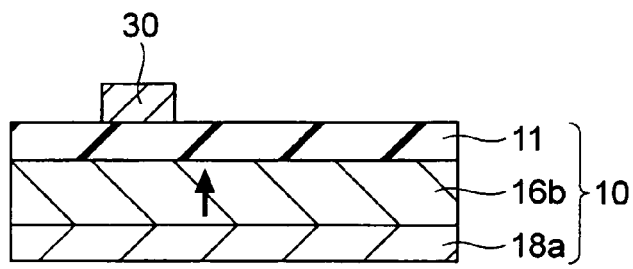

FIGS. 5A and 5B show seventh and eighth examples of the continuous film 10. The continuous film 10 of the seventh and eighth illustrative examples includes a single magnetic layer, and the spin wave generator itself is formed of a conductive magnetic material. The continuous film 10 of the seventh example shown in FIG. 5A has the following configurations: the magnetic layer 16a having the magnetization direction substantially parallel to the film surface is provided on the antiferromagnetic layer 18; the spacer layer 14 is provided on the magnetic layer 16a; and the spin wave generator 20a having magnetization substantially perpendicular to the film surface is provided on the spacer layer 14 so as to contact the upper surface of the spacer layer 14.

The continuous film 10 of the eighth illustrative example shown in FIG. 5B has the following configurations:
the magnetic layer 16b having the magnetization direction substantially perpendicular to the film surface is provided on the antiferromagnetic layer 18;
the spacer layer 14 is provided on the magnetic layer 16b; and
the spin wave generator 20b having magnetization substantially parallel to the film surface is provided on the spacer layer 14 so as to contact the upper surface of the spacer layer 14.
In order to excite spin waves with lower energy, it is desirable that the magnetization direction of the spin wave generator is substantially perpendicular to the magnetization direction of the magnetic layer, as in the seventh and eighth examples.

A signal detection electrode 30 is provided on the continuous film 10 via a contact surface, and detects, as a synthesized signal, spin waves which are generated under the respective spin wave generators $20_i$ (i=1 to n) and propagate through the continuous film 10. When the signal detection electrode 30 detects signals, in order to prevent from complicating detection signals as a result of spin wave excitation from the signal detection electrode 30 itself, it is desirable that the contact surface of the signal detection electrode 30 is larger than the respective contact surface of the spin wave generators $20_1$ to $20_n$. When the signal detection electrode 30 has a dot shape whose contact surface is larger than each spin wave generator $20_i$ (i=1 to n), spin waves can be detected using a TMR effect or a GMR effect which a sandwich structure of the continuous film 10 causes. Then, a voltage is applied, or an electric current is passed in a direction substantially perpendicular to the dot-shaped contact surface of the signal detection electrode 30 to detect signal. Here, a signal change due to spin waves is small. Thus, when the layered structure with two magnetic layers is used for the continuous film, the two magnetic layers are configured to preferably make their respective magnetization directions substantially orthogonal to each other, thereby allowing it to increase the detection sensitivity. In addition, when the complexity of detection signals is negligible, making the size of the contact surface of the signal detection electrode 30 equal to that of the spin wave generators $20_i$ (i=1 to n) allows it to alter input and output after forming the electrode.

Figure 9A:
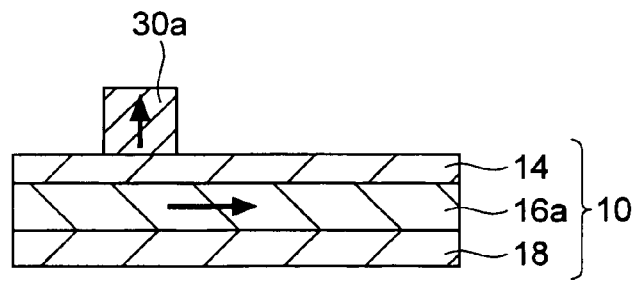
FIGS. 9A and 9B are cross sectional views each showing an example of a combination of a continuous film and a signal detection electrode in the first embodiment.
Figure 9B:
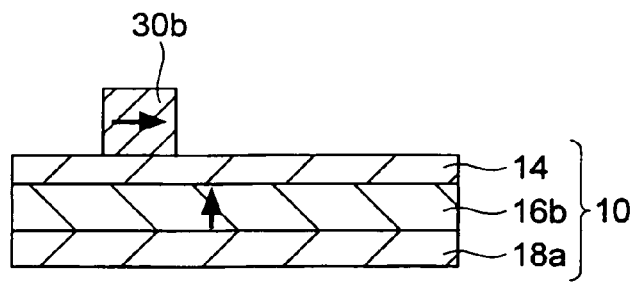

Examples of combinations of the continuous film 10 and the signal detection electrode 30 in the signal processing device of the embodiment will be described below with reference to FIGS. 6A to 9B. The continuous films 10 shown in FIGS. 6A to 9B correspond to the first to eighth examples shown in FIGS. 2A to 5B, respectively. Therefore, the signal detection electrodes 30 shown in FIGS. 6A to 8B are formed of a nonmagnetic conducting material. The signal detection electrodes 30a, 30b shown in FIGS. 9A and 9B are formed of a magnetic material having the magnetization direction thereof substantially parallel to the film surface and a magnetic material having the magnetization direction thereof substantially perpendicular to the film surface, respectively.

Figure 10A:
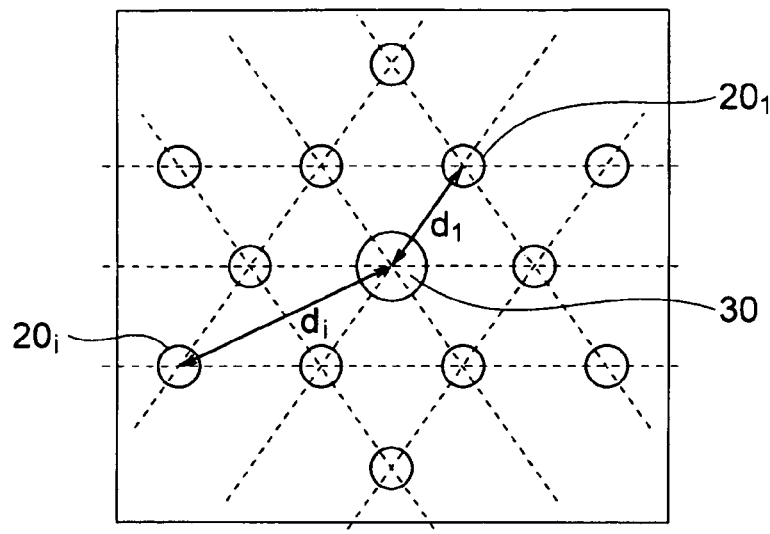
FIGS. 10A and 10B are views each showing one example of arrangement of a spin wave generator and a signal detection electrode in the first embodiment.
Figure 10B:
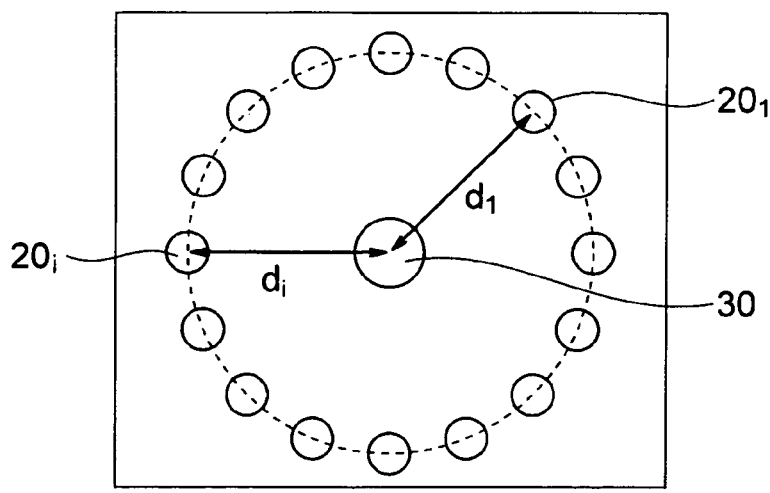

Next, a relationship between the spin wave generator and the signal detection electrode will be described. When multi-input signal processing is performed by inputting a signal to each of the multiple spin wave generators $20_1$ to $20_n$, the spin wave generators $20_1$ to $20_m$ (1<m≤n) are arranged on the continuous film 10 as follows.

$$|\cos(k_j d_j - \omega_j(t_D - t_j)) - \cos(k_i d_i - \omega_i(t_D - t_i))| < 2 \quad (1)$$

where $d_i$, $k_i$, $\omega_i$, $t_i$ and $t_D$ are defined as follows:
$d_i$ is a distance (shortest distance) from the center of gravity of one of the spin wave generators $20_i$ (i=1 to m) (that is i-th spin wave generator) to the signal detection electrode 30;
$k_i$ is a wavenumber of a spin wave traveling from the i-th spin wave generator $20_i$ to the signal detection electrode 30;
$\omega_i$ is an oscillation frequency of the spin wave traveling from the i-th spin wave generator $20_i$ to the signal detection electrode 30;
$t_i$ is a signal input time to the i-th spin wave generator $20_i$;
$t_D$ is a signal detection time in the signal detection electrode 30 described above;
and $d_j$, $k_j$, $\omega_j$, and $t_j$ are defined as follows:
$d_j$ is a distance (shortest distance) from the center of gravity of one of the spin wave generators $20_j$ (j=1 to m) (that is j-th spin wave generator) to the signal detection electrode 30;
$k_j$ is a wavenumber of a spin wave traveling from the j-th spin wave generator $20_j$ to the signal detection electrode 30;
$\omega_j$ is an oscillation frequency of the spin wave traveling from the j-th spin wave generator $20_j$ to the signal detection electrode 30;
$t_j$ is a signal input time to the j-th spin wave generator $20_j$; and
j≠i (j=1 to m).
The examples of arrangement of spin wave generators and a signal detection electrode is shown in FIGS. 10A and 10B. Here, the wavenumber and the oscillation frequency relate to a spin wave which is a fundamental wave with the largest amplitude. The frequency can be detected actually by an oscilloscope. The center of gravity is a position where the center of gravity of the spin wave generating portion is projected into the continuous film surface. The above expression (1) represents the following condition. When the spin wave propagating through the continuous film 10 reaches the signal detection electrode 30 after the same signal is inputted (1 is inputted when the input signal is 1 or 0, for example) in the spin wave generator $20_j$ and the spin wave generator $20_i$ (i≠j), peaks and troughs of the spin waves do not overlap each other. This condition should be met between at least two spin wave generators of two or more spin wave generators, and the signal detection electrode. This is because, if the peaks and troughs of the spin waves overlap with each other in the signal detection electrode 30, an amplitude of a synthesized signal at the signal detection electrode 30 is very small, thereby making it difficult to detect the signal. FIG. 10A shows a configuration in which the spin wave generators $20_i$ (i=1 to n) are arranged like a grid around the signal detection electrode 30. FIG. 10B shows a configuration in which the spin wave generators $20_i$ (i=1 to n) are arranged on the same circumference centered at the signal detection electrode 30.

An input signal Input-i to be inputted to each spin wave generator $20_i$ (i=1 to n) is inputted by making a polarity of current or voltage to be passed through or applied to the spin wave generator $20i$ correspond to an input signal 0 or 1, or by making presence and absence of voltage to be applied to the spin wave generator $20_i$ correspond to the input signal 0 or 1. The spin waves thus exited propagate, and intensity of the detection signal of the spin waves synthesized under the signal detection electrode 30 is outputted. In other words, the signal detection electrode 30 outputs the spin waves which are generated and transmitted by the spin wave generators and the continuous film as a TMR signal or a GMR signal.

Such a configuration enables addition of input signals while preventing malfunction. On the other hand, if any two spin wave generators which satisfy the relationship of the above expression (1) do not exist, two input signals cannot be synthesized at all, and thus signal processing is impossible.

As described above, according to the embodiment, exciting two or more spin waves in the continuous film allows it to detect synthetic waves, thereby enabling signal processing of two or more inputs with low power.

Next, each elements included in the signal processing device of the embodiment will be described in detail. Magnetic layers having magnetization directed substantially perpendicular to the film surface and magnetization directed substantially parallel to the film surface can be creatively used for magnetic layers of the continuous film, depending on requested property, as appropriate. Here, the "magnetic layer" means a unit of unified motion of magnetization. When a magnetic layer having magnetization directed substantially perpendicular to the film surface is used as a propagation medium for the spin waves, the spin wave properties (frequency and propagating speed) can be made uniform, irrespective of the propagation direction. Thus, a design margin for providing the spin wave generator is allowed. On the other hand, if anisotropic propagation is needed, it is desirable to use a magnetic layer having magnetization directed to a direction parallel to the layer as a spin wave propagation medium.

As a magnetic layer material having magnetization directed substantially perpendicular to the film surface, FeVPd, FeCrPd, CoFePt, or the like can be used. In other words, alloys containing at least one element selected from a group consisting of iron (Fe), cobalt (Co), nickel (Ni), manganese (Mn), and chrome (Cr) and at least one element selected from a group consisting of platinum (Pt), palladium (Pd), iridium (Ir), ruthenium (Ru), and rhodium (Rh) can be used. The properties of the alloys can be adjusted by changing alloy compositions of the alloys, or by heat treatment of the alloys. An amorphous alloy of rare earth-transition metal such as TbFeCo, GdFeCo or the like and layered structures of Co/Pt, Co/Pd, and Co/Ni are also desirable.

A magnetic layer having a magnetization easy axis (magnetization direction) substantially parallel to the film surface includes a magnetic metal containing at least one element selected from the group consisting of iron (Fe), cobalt (Co), nickel (Ni), manganese (Mn), and chrome (Cr), for example.

When the magnetic body mentioned above is used for a magnetic layer, a frequency of the high frequency magnetic field to be generated from the magnetic layer can be tuned by adjusting magnetic anisotropy and saturated magnetization. In addition, a state density of a Fermi surface like in a half-metal is decreased to reduce the attenuation rate of spin waves.

Furthermore, if a ferritic oxide such as yttrium iron garnet, manganese ferrite, or γ-iron oxide is used as the magnetic continuous film, loss of spin waves can be reduced.

In the embodiment, the "magnetic layer" means a unit of unified motion of magnetization. A laminated film with a ferrimagnetic or antiferromagnetic laminated structure such as an antiferromagnetically interlayer-coupled CoFe/Ru/Co and a ferromagnetically-coupled laminated film can be treated as a single magnetic layer. Particularly, when the antiferromagnetically interlayer-coupled magnetic film is used as a so-called fixed layer which is in contact with the antiferromagnetic layer (the magnetic layer 16 in FIG. 1), spin waves can be well controlled.

As the spacer layer, a tunnel barrier material is used in some cases, and a nonmagnetic metal material is used in other cases. Both materials can be used as appropriate, depending on a requested property. Using the tunnel barrier material as the spacer layer allows it to obtain a high reproduced signal output at the time of readout. Specifically, an oxide, a nitride, a fluoride, an oxynitride or the like containing at least one element selected from a group consisting of aluminum (Al), titanium (Ti), zinc (Zn), zirconium (Zr), tantalum (Ta), cobalt (Co), nickel (Ni), silicon (Si), magnesium (Mg), and iron (Fe) can be used as the tunnel barrier material. Alternatively, a semiconductor having a large energy gap, such as GaAlAs is preferably used as the tunnel barrier material. When the tunnel barrier material is used as the spacer layer, it is preferable to form the spacer layer with a thickness of 0.2 nm to 2.0 nm in order to obtain a high reproduced signal output.

A nonmagnetic metal is used as the spacer layer to provide a structure enabling it to easily inject a spin current for generating spin torque. Specific materials as the nonmagnetic metal include copper (Cu), gold (Au), silver (Ag), aluminum (Al), and an alloy containing at least one element selected from a group consisting of the copper (Cu), gold (Au), silver (Ag), and aluminum (Al). If the thickness of the spacer layer is 1.5 nm or more and 20 nm or less, the magnetic layer 12 and the magnetic layer 16 are not interlayer-coupled with each other, for example, in FIG. 1, and at the same time, a spin polarized state of conduction electrons is not lost when the conduction electrons pass through the spacer 14.

A conductive magnetic material or a nonmagnetic material is used for the spin wave generator and the signal detection electrode. Specific examples of the magnetic material include materials similar to the materials for the magnetic layer. The nonmagnetic material includes copper (Cu), gold (Au), silver (Ag), aluminum (Al), or an alloy containing at least one element selected from a group consisting of the copper (Cu), gold (Au), silver (Ag), and aluminum (Al). Furthermore, as the nonmagnetic conductive material, a material such as carbon nanotube, carbon nanowire, or graphene can be used. In addition, as the conductive protection layer, Ta, Ru, copper (Cu), gold (Au), silver (Ag), aluminum (Al), an alloy containing at least one element selected from a group consisting of copper (Cu), gold (Au), silver (Ag), and aluminum (Al), a material such as graphene, or the like can be used.

Second Embodiment

Figure 11:
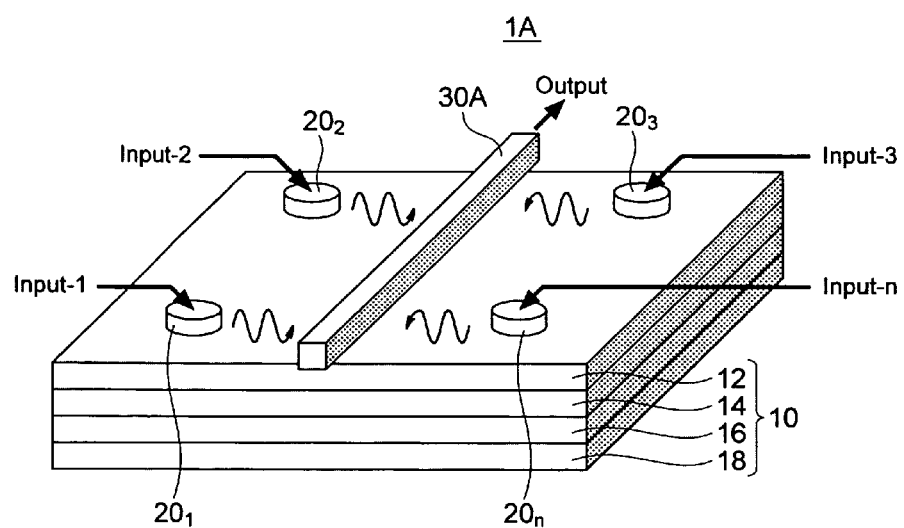
FIG. 11 is a schematic view showing a signal processing device according to a second embodiment.

Next, a signal processing device according to a second embodiment of the invention is shown in FIG. 11. The signal processing device 1A of the embodiment is different from the signal processing device of the first embodiment shown in FIG. 1 in that the signal detection electrode 30 is replaced by a signal detection electrode 30A. The signal processing device 1A of the second embodiment corresponds to the signal processing device of the first embodiment shown in FIG. 1 whose signal detection electrode 30 is replaced by a signal detection electrode 30A. The signal detection electrode 30A has an elongate line shaped contact surface in contact with the continuous film 10, and includes a conducting material. When a magnetic layer of the continuous film 10 includes a metal, the signal processing device 1A has an insulation layer (not shown) between the signal detection electrode 30A and the magnetic layer of the continuous film 10. Although the signal detection electrode 30A includes one line in FIG. 11, a ground line may be provided adjacent to the signal detection electrode 30A to make a so-called coplanar type conducting line.

In the signal processing device 1A of the embodiment, when the spin wave reaches the signal detection electrode 30A, induced electromotive force is generated in the signal detection electrode 30A. The induced electromotive force is detected to perform signal detection.

Figure 12A:
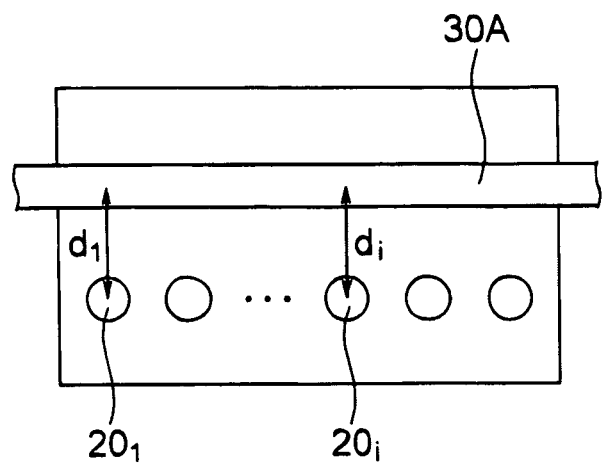
FIGS. 12A and 12B are views each showing one example of arrangement of a spin wave generator and a signal detection electrode in the second embodiment.
Figure 12B:
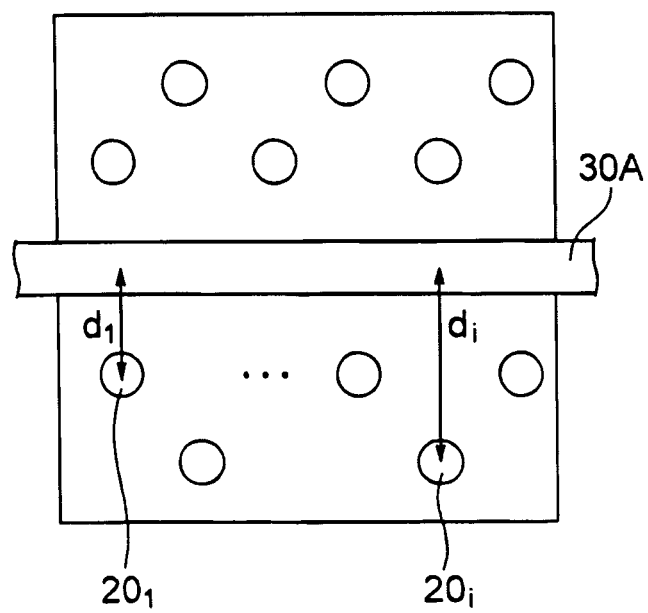

As shown in FIG. 12A and FIG. 12B, each spin wave generator $20_m$ (i=1 to m) (1<m≤n) and the signal detection electrode 30A are arranged to have the following relationship:

$$|\cos(k_j d_j - \omega_j (t_D - t_j)) - \cos(k_i d_i - \omega_i (t_D - t_i))| < 2 \quad (2)$$

where $d_i$, $k_i$, $\omega_i$, $t_i$ and $t_D$ are defined as follows;
$d_i$ is a distance (shortest distance) from the center of gravity of i-th spin wave generator $20_i$ (i=1 to m) to the signal detection electrode 30;
$k_i$ is a wavenumber of a spin wave traveling from the i-th spin wave generator $20_i$ to the signal detection electrode 30A;
$\omega_i$ is an oscillation frequency of the i-th spin wave described above;
$t_i$ is a signal input time to the i-th spin wave generator $20_i$;
$t_D$ is a signal detection time in the signal detection electrode 30 described above; and $d_j$, $k_j$, $\omega_j$, and $t_j$ are defined as follows:
$d_j$ is a distance (shortest distance) from the center of gravity of j-th spin wave generator $20_j$ (j=1 to m) to the signal detection electrode 30;
$k_j$ is a wavenumber of a spin wave traveling from the j-th spin wave generator $20_j$ to the signal detection electrode 30A;
$\omega_j$ is an oscillation frequency of the j-th spin wave described above;
$t_j$ is a signal input time to the j-th spin wave generator $20_j$;
and j≠i (j=1 to m).

For example, FIG. 12A shows a configuration in which the spin wave generators $20_i$ (i=1 to n) are all arranged in one of two regions divided by the signal detection electrode 30A. FIG. 12B shows a configuration in which the spin wave generators are arranged to be substantially equal in the two regions divided by the signal detection electrode 30A. Such a configuration enables addition of input signals while preventing malfunction as well as in the first embodiment.

An input signal Input-i to be inputted to each spin wave generator $20_i$ (i=1 to n) is inputted so as to make polarity of a current to be passed through or a voltage to be applied to the spin wave generator $20_i$ correspond to an input signal 0 or 1, or so as to make existence or nonexistence of a voltage to be applied to the spin wave generator $20_i$ correspond to an input signal 0 or 1. The spin waves thus exited propagate, and intensity of the detection signal of the spin waves synthesized under the signal detection electrode 30A is outputted.

Such a configuration enables addition of input signals while preventing malfunction. On the other hand, if any two spin wave generators which satisfy the relationship of the above expression (2) do not exist, two input signals cannot be synthesized at all, and thus signal processing is impossible.

As mentioned above, according to the embodiment, exciting multiple spin waves in the continuous film allows it to detect synthetic waves, thereby enabling signal processing of two or more inputs with low power.

First Example

Figure 13:
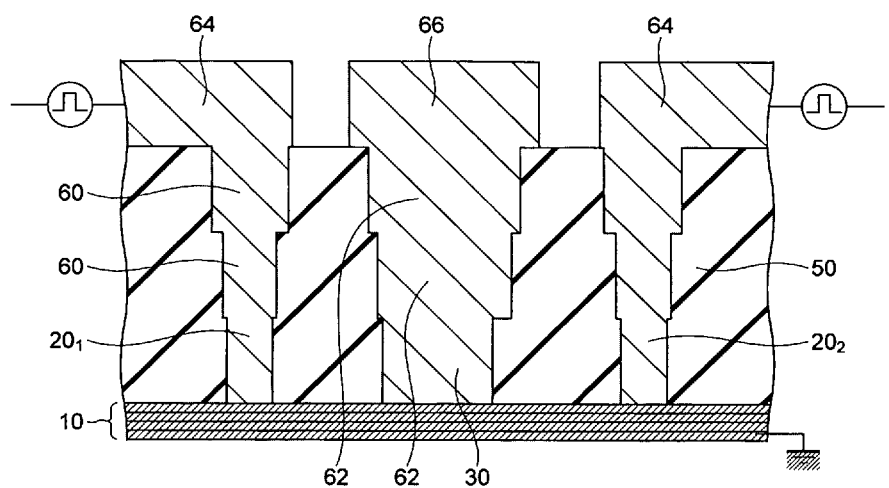
FIG. 13 is a cross sectional view of a signal processing device according to a first example.

A first example of the invention will be described hereinafter with reference to FIG. 13. The first example is a signal processing device of the first and second embodiments, which is provided with two spin wave generators $20_1$, $20_2$ on the continuous film 10 and the signal detection electrode 30 in the center as shown in FIG. 13. Results of experiments on a positional relationship between the spin wave generators $20_1$, $20_2$ and the signal detection electrode 30 in the first example are described. Here, each contact surface of the spin wave generators $20_1$, $20_2$ in contact with the continuous film and a contact surface of the signal detection electrode 30 in contact with the continuous film are circles whose diameters of the contact surfaces are 50 nmφ and 300 nmφ, respectively. Test samples S1 to S6 with respective six combinations of distances $d_1$, $d_2$, which are different from each other as shown in Table 1, are provided. Here, the distances $d_1$, $d_2$, are each a distance from the respective centers of gravity of the spin wave generators $20_1$, $20_2$ on the contact surface thereof to the center of the gravity on the contact surface of the signal detection electrode 30.

TABLE 1

| Sample No. | $d_1$ (nm) | $d_2$ (nm) | Value in the left term of the expression (1) |
|---|---|---|---|
| S1 | 40 | 45 | 0.9 |
| S2 | 40 | 27.5 | 1.8 |
| S3 | 30 | 40 | 2 |
| S4 | 25 | 30 | 0.8 |
| S5 | 20 | 40 | 0 |
| S6 | 30 | 50 | 0 |

The continuous film 10 is a laminated film of CoFe/CoFeB/MgO/CoFeB/FePd where an in-plane magnetization layer and a perpendicular magnetization layer are stacked on each other with a spacer layer sandwiched therebetween. Magnetization of a lower magnetic layer (CoFe/CoFoB) of the laminated film is fixed by an antiferromagnetic layer including IrMn, so that the magnetization is directed from left to right on the view. Meanwhile, magnetization of an upper magnetic layer (CoFeB/FePd) is directed from down to up on the view using a hard magnet provided outside. This allows it to provide two spin waves to be excited by the spin wave generators $20_1$, $20_2$ with the same frequency and wavenumber.

The test samples are produced as follows. First, a lower electrode (not shown) is formed on a wafer, and the wafer is then placed in an ultrahigh vacuum sputtering system. Then, a IrMn layer, a CoFe/CoFeB layer, a MgO layer, a CoFeB/FePd layer, and a cap layer including Ru are stacked in this order with the lower electrode to provide the continuous film. Then, magnetization of the CoFe/CoFeB layer is fixed through annealing in a magnetic field.

Next, EB (electron beam) resist is applied onto the cap layer to perform EB exposure, thereby forming openings in the EB resist which correspond to the spin wave generators and the signal detection electrode. Then, Cu is formed to be embedded into the openings corresponding to the spin wave generators and the signal detection electrode. Then the EB resist is removed to provide spin wave generators $20_1$, $20_2$ and the signal detection electrode 30.

A $SiO_2$ film is formed to completely cover the continuous film 10, the spin wave generators $20_1$, $20_2$, and the signal detection electrode 30. Then, the surface of the $SiO_2$ film is planarized by ion milling to expose the upper surfaces of the spin wave generators $20_1$, $20_2$ and the signal detection electrode 30.

Next, connecting electrodes 60 connected to the spin wave generators $20_1$, $20_2$, and a connecting electrode 62 connected to the signal detection electrode 30 are formed. Resist is applied to the entire surface, and is patterned using a KrF stepper exposure system to form the connecting electrodes 60, 62, thereby forming openings in the resist which connect to the spin wave generators $20_1$, $20_2$ and the signal detection electrode 30. Cu is embedded into the openings, and the resist is removed, thereby forming a first portion of the connecting electrodes 60, 62. The $SiO_2$ film is formed to cover the entire surface. The surface of the $SiO_2$ film is planarized by ion milling to expose the upper surfaces of the electrodes mentioned above.

Steps using a KrF stepper exposure system are repeated several times, thereby setting upper several portions of the connecting electrodes 60, 62 for the spin wave generators $20_1$, $20_2$ and the signal detection electrode 30 to be perpendicular to the continuous film 10. Finally, upper electrodes 64, 66 connected, respectively, to the connecting electrodes 60, 62 are formed. In addition, a pulsed current with a half-value width of 100 ps was passed through the spin wave generators $20_1$, $20_2$ to preliminarily perform time-resolved detection at signal detection electrodes having different distances. The time-resolved detection confirmed that the center frequency of spin waves propagating was approximately 12.2 GHz, and the center wavenumber was 0.3 $\mu m^{-1}$.

A positive pulsed current with a half-value width of 100 ps was passed through the spin wave generators $20_1$, $20_2$ of each test sample in response to a first input signal with a value of "1," and a negative pulsed current with a half-value width of 100 ps was passed through the spin wave generators $20_1$, $20_2$ of each test sample in response to a second input signal with a value of "0." Then, an output signal, i.e., a synthesized signal was detected using a current of 10 μA at the signal detection electrode 30 after 1.5 ns from the signal inputting.

Figure 14:
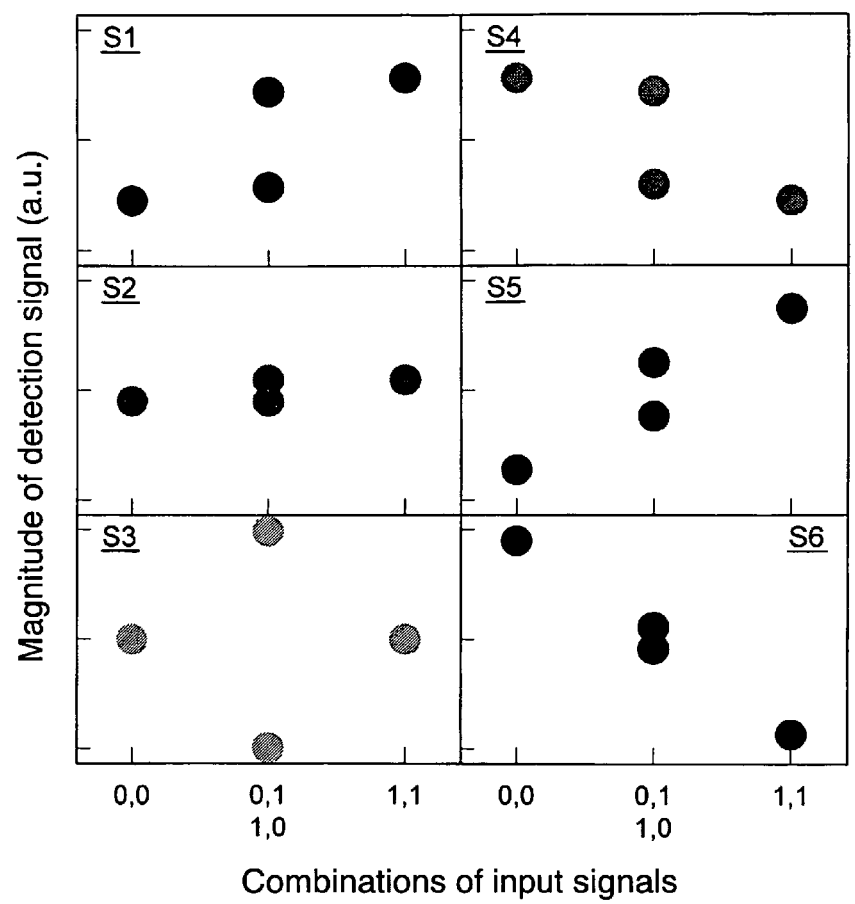
FIG. 14 is a view showing a relationship between combinations of input signals in respective test samples according to the first example and intensity of detection signals.

FIG. 14 is a graph showing summarized intensities of output signals versus combinations of input signals for each test sample. In the test samples S1, S2, S4, S5, S6, changes in the intensities is substantially linear with respect to the combination of the input signals. Operations of addition can be performed in the test samples S1, S2, S4, S5, S6, although the polarity of the changes was reversed in some cases. The addition operation can not be performed in the test sample S3. The test sample S3 is an example where the condition of the expression (1) is not be satisfied, and it was shown that the addition operation could not be performed in this case.

Second Example

A second example of the invention will be described below. In the second example, the magnetization directions of the two magnetic layers of the continuous film are antiparallel to each other, or orthogonal to each other.

A laminated film including IrMn/CoFe/CoFeB/MgO/CoFeB/CoFe/Ru is formed as the continuous film to produce a test sample including the laminated film for a signal processing device as well as for the first example. Considered were two cases. The magnetization direction of the upper magnetic layer (CoFeB/CoFE) of the continuous film was set to make an angle of 180° with that of the lower magnetic layer (CoFe/CoFeB) in the case 1, and set to make an angle of 90° with that of the lower magnetic layer (CoFe/CoFeB) in the case 2 by using a hard magnet provided outside. Then, a ratio of the output signal for the case 2 to that for the case 1 was measured with applying a voltage of 10 µV to the signal detection electrode 30 and without changing an input signal. As a result, the output signal ratio (=signal intensity for the case 2/signal intensity for the case 1) was 42.5, thereby meaning that the signal intensity for the case 2 was larger. Hence, making the magnetization directions of the two magnetic layers orthogonal to each other tends to increases the signal intensity.

Third Example

Figure 15:
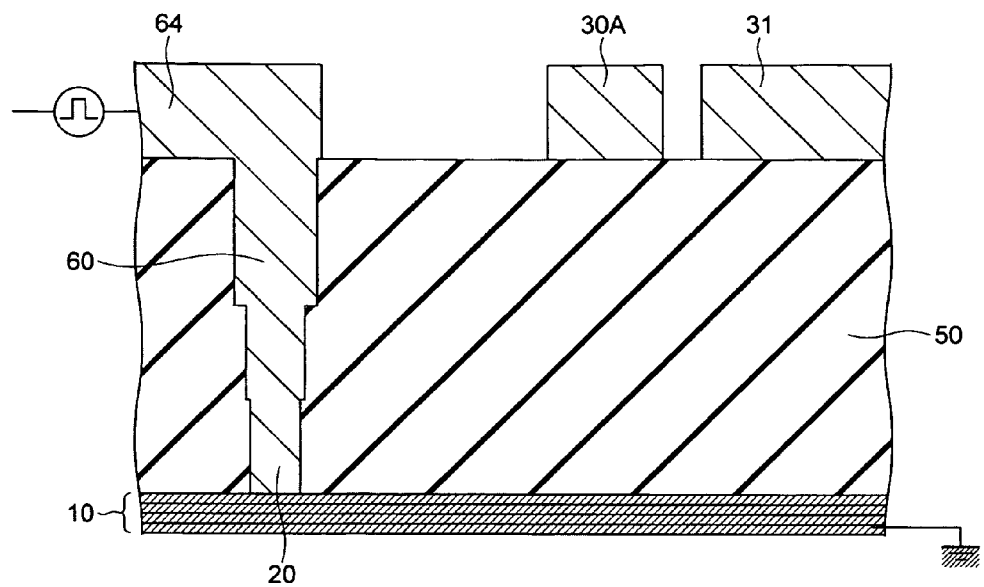
FIG. 15 is a cross sectional view of a signal processing device according to a third example.
Figure 16:
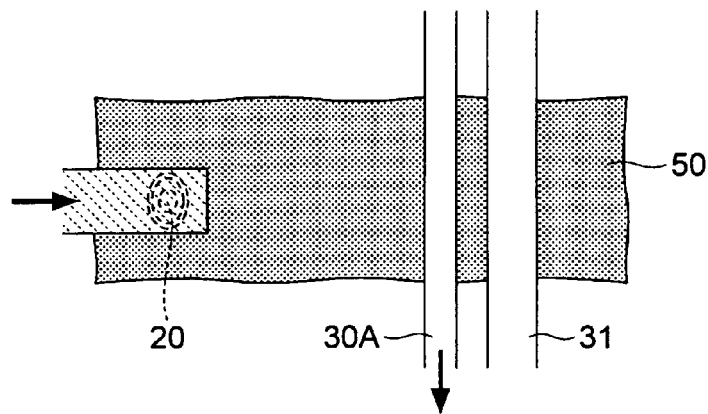
FIG. 16 is a top view of the signal processing device according to the third example.

A third example of the present invention will be described hereinafter with reference to FIGS. 15 and 16. FIG. 15 shows a cross sectional view of a signal processing device of the third example. FIG. 16 shows a top view thereof. As shown in FIGS. 15 and 16, the third example includes a continuous film 10, a spin wave generator 20 provided on the continuous film 10, and a signal detection electrode 30A of coplanar type to which a ground line 31 is provided adjacently. The spin wave generator 20 is connected to an upper electrode 64 through the connecting electrode 60. In addition, the signal detection electrode 30 and a ground line 31 are provided on an insulating film 50 formed on the continuous film 10. The signal processing device of the third example is manufactured using the method described in the first example.

Figure 17:
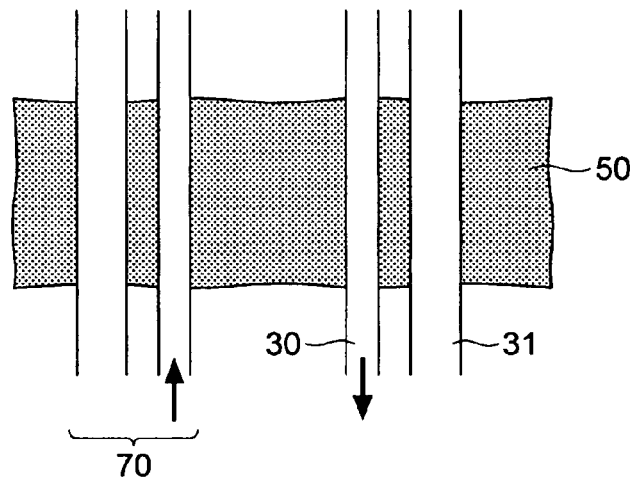
FIG. 17 is a top view of a signal processing device according to a comparative example of the third example.

As a comparative example of the third example, a signal processing device in which a coplanar transmission line 70 as shown in FIG. 17 is used for signal input and spin waves are excited by the magnetic field is produced. Here, the continuous film 10 in the third example and the comparative example includes IrMn/CoFe/Cu/CoFe/Cu/Ta. Here, a Cu layer sandwiched by the two magnetic layers including CoFe is a spacer layer.

In such two signal processing devices, magnetization of the upper magnetic layer (CoFe (coercive force is 200 Oe)) of the continuous film 10 is locally inclined by 10° to consider conditions for generating spin waves. As in the comparative example shown in FIG. 17, using a magnetic field generated from the transmission line 70 requires a magnetic field of 350 Oe to be generated. Accordingly, there arises a requirement to pass a pulsed current of 3 mA through the transmission line.

On the other hand, it is necessary to pass a pulsed current of 70 µA in order to locally incline magnetization by 10° based on spin torque generated by the spin wave generator 20 as well as in the third example. It should be noted that the spin wave excitation using the spin wave generator 20 as in the third example makes it easy to spatially form multiple electrodes, and is also excellent in reducing power.

Fourth Example

A signal processing device according to a fourth example of the invention will be described hereinafter with reference to FIG. 18.

Figure 18:
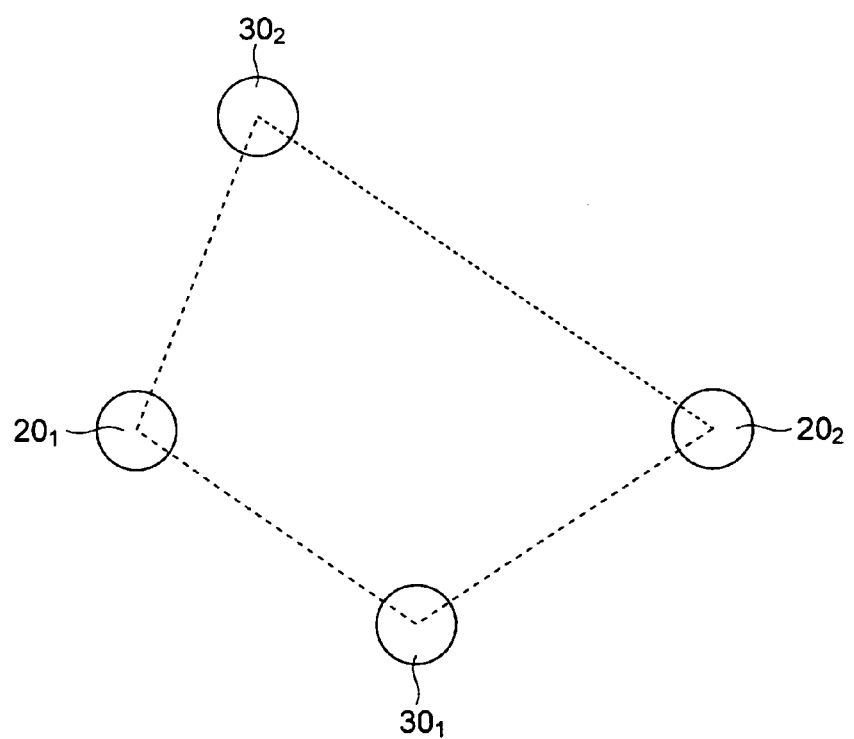
FIG. 18 is a view showing an arrangement of spin wave generators and signal detection electrodes in a signal processing device according to a fourth example.

As shown in FIG. 18, the signal processing device of the fourth example has first and second spin wave generators $20_1$, $20_2$ which are provided on a continuous film (not shown). The signal processing device of the example has also first and second signal detection electrodes $30_1$, $30_2$ which are provided on the continuous film (not shown). A perpendicular magnetization film is used as a continuous film which serves as a spin wave medium. A contact surface of the first and second spin wave generators $20_1$, $20_2$ and the signal detection electrodes $30_1$, $30_2$ is circular in shape, and is 100 nmφ in diameter. A distance between the first spin wave generator $20_1$ and the first signal detection electrode $30_1$, a distance between the first spin wave generator $20_1$ and the second signal detection electrode $30_2$, and a distance between the second spin wave generator $20_2$ and the first signal detection electrode $30_1$ are all set to 20 µm which is the same as the wavelength of the excited spin wave. On the other hand, a distance between the second spin wave generator $20_2$ and the second signal detection electrode $30_2$ is set to 30 µm which is 1.5 times the wavelength 20 µm of the excited spin wave.

In the example, input signals with a value of "0" or "1" are made to correspond to absence and presence of a voltage to be applied to the spin wave generator, respectively. Then, relative intensities of signals to be detected in the first signal detection electrode $30_1$ and the second signal detection electrode $30_2$ are shown in FIG. 19A and FIG. 19B. It is shown that if a detection threshold is set to 0.5 in the detection electrodes, logical add (OR) in a logical operation is performed in the first signal detection electrode $30_1$ and negation of exclusive OR (XOR) is performed in the second signal detection electrode $30_2$. Providing multiple signal detection electrodes as described above makes it possible to perform different operations.

As described above, according to the signal processing device of the embodiments of the present invention, it is possible to provide an information processing device which is driven with low power consumption and is suited for addition of multi-input signals.

The embodiments of the present invention have been described so far. However, the present invention shall not be limited to the description. Any embodiment described above to which one skilled in the art has made a design change, as appropriate, shall also be included in the scope of the present invention as far as they have the characteristics of the present invention.

In addition, any element which any embodiment described above includes can be combined as far as it is technologically possible, and a combination thereof shall also be included in the scope of the present invention as far as it has the characteristics of the present invention.

What is claimed is:
1. A signal processing device comprising:
 a continuous film including at least one magnetic layer;
 first and second spin wave generators which are provided on the continuous film in such a manner as to be in direct contact with the continuous film or be in contact with the continuous film via an insulation layer interposed therebetween, and each of which has a contact surface with the continuous film in a dot shape and generates a spin wave in a region of the magnetic layer of the continuous film by receiving an input signal, the region being immediately under the contact surface; and
 at least one signal detector which is provided on the continuous film and detects, as an electrical signal, the spin waves generated by the spin wave generators and propagating through the continuous film, wherein
 a straight line between the first and second spin wave generators and a straight line between the first spin wave generator and the at least one signal detector are on the continuous film, and a straight line between the first spin wave generator and the at least one signal detector and a straight line between the second spin wave generator and the at least one signal detector are non-overlapping.

2. A signal processing device comprising:
a continuous film containing at least one magnetic layer;
a plurality of spin wave generators which are provided on the continuous film in such a manner as to be in direct contact with the continuous film or be in contact with the continuous film while having an insulation layer interposed therebetween, each of which has a contact surface with the continuous film in a dot shape; and
at least one signal detector which is provided on the continuous film,
wherein
at least two of the plurality of spin wave generators and the signal detector are arranged to satisfy a relation of $|\cos(k_j d_j - \omega_j(t_D - t_j)) - \cos(k_i d_i - \omega_i(t_D - t_i))| < 2$; and wherein
$d_j$ is a shortest distance from a center of gravity of the j-th spin wave generator to the signal detector;
$k_j$ is a wavenumber of a spin wave traveling from the j-th spin wave generator to the signal detector;
$\omega_j$ is an oscillation frequency of the spin wave generated from the j-th spin wave generator;
$t_j$ is a time of signal input to the j-th spin wave generator;
$d_i$ ($i \neq j$) is the shortest distance from a center of gravity of the i-th spin wave generator to the signal detector;
$k_i$ is a wavenumber of a spin wave traveling from the i-th spin wave generator to the signal detector;
$\omega_i$ is an oscillation frequency of the spin wave generated from the i-th spin wave generator;
$t_i$ is a time of signal input to the i-th spin wave generator; and
$t_D$ is a time of signal detection in the signal detector.

3. The device according to claim 1, wherein the input signal is any one of a current passing through a contact surface between each of the spin wave generators and the continuous film, and a voltage applied to each of the spin wave generators.

4. The device according to claim 1, wherein the contact surface between each of the spin wave generators and the continuous film has a maximum diameter of 500 nm or less.

5. The device according to claim 1,
wherein
the spin wave generators include a nonmagnetic metal;
wherein
the continuous film has a layered structure of a first magnetic layer, a nonmagnetic spacer layer and a second magnetic layer; and
wherein
the first and the second magnetic layers have magnetization directions substantially orthogonal to each other.

6. The device according to claim 5, wherein the nonmagnetic spacer layer includes a tunnel barrier material.

7. The device according to claim 5, wherein the continuous film has a laminated structure in which an antiferromagnetic layer, the first magnetic layer having a magnetization direction substantially parallel to a film surface, the nonmagnetic spacer layer, and the second magnetic layer having a magnetization direction substantially perpendicular to the film surface are stacked in this order.

8. The device according to claim 5, wherein the continuous film has a laminated structure in which an antiferromagnetic layer, the first magnetic layer having a magnetization direction substantially parallel to a film surface, the nonmagnetic spacer layer, and the second magnetic layer having a magnetization direction substantially parallel to the film surface are stacked in this order.

9. The device according to claim 1,
wherein
the spin wave generators include nonmagnetic metal; and
wherein
the continuous film includes a single magnetic layer.

10. The device according to claim 9, wherein the continuous film is provided with an antiferromagnetic layer on a surface on a side opposite to a surface contacting with the spin wave generators.

11. The device according to claim 1,
wherein
the spin wave generators include magnetic metal; and
wherein
the continuous film is provided with the antiferromagnetic layer on a surface on a side opposite to a surface contacting with the spin wave generators.

12. The device according to claim 1, wherein
the signal detector is formed to be in contact with the continuous film, has a contact surface with the continuous film in a dot shape; and detects the spin waves by passing a current through the contact surface or by applying a voltage in a direction substantially perpendicular to the contact surface.

13. The signal processing device according to claim 1,
wherein
the signal detector is formed on the continuous film with an insulation layer interposed therebetween; and
wherein
an area where the signal detector and the continuous film overlap each other has a linear shape.

14. A signal processing method of a signal processing device, the signal processing device comprising:
a continuous film including at least one magnetic layer;
first and second spin wave generators which are provided on the continuous film in such a manner as to be in direct contact with the continuous film or be in contact with the continuous film via an insulation layer interposed therebetween, and each of which has a contact surface with the continuous film in a dot shape and generates a spin wave in a region of the magnetic layer of the continuous film by receiving an input signal, the region being immediately under the contact surface; and
at least one signal detector which is provided on the continuous film and detects, as an electrical signal, the spin waves generated by the spin wave generators and propagating through the continuous film, wherein
a straight line between the first and second spin wave generators and a straight line between the first spin wave generator and the at least one signal detector are on the continuous film, and
a straight line between the first spin wave generator and the at least one signal detector and a straight line between the second spin wave generator and the at least one signal detector are non-overlapping,
the method comprising:
making polarity of a current or a voltage to be inputted as an input signal to each of the spin wave generators correspond to any one of 0 and 1 of the input signal; and
setting intensity of a detection signal detected by the signal detector to a signal output.

15. A signal processing method of a signal processing device, the signal processing device comprising:

a continuous film including at least one magnetic layer;
first and second spin wave generators which are provided on the continuous film in such a manner as to be in direct contact with the continuous film or be in contact with the continuous film via an insulation layer interposed therebetween, and each of which has a contact surface with the continuous film in a dot shape and generates a spin wave in a region of the magnetic layer of the continuous film by receiving an input signal, the region being immediately under the contact surface; and
at least one signal detector which is provided on the continuous film and detects, as an electrical signal, the spin waves generated by the spin wave generators and propagating through the continuous film, wherein
a straight line between the first and second spin wave generators and a straight line between the first spin wave generator and the at least one signal detector are on the continuous film, and
a straight line between the first spin wave generator and the at least one signal detector and a straight line between the second spin wave generator and the at least one signal detector are non-overlapping,
the method comprising:
making any one of presence and absence of a voltage to be inputted as an input signal to each of the spin wave generators correspond to any one of 0 and 1 of the input signal; and
setting intensity of a detection signal detected by the signal detector to a signal output.

\* \* \* \* \*